(12) United States Patent
Kim et al.

(10) Patent No.: US 8,237,240 B2
(45) Date of Patent: Aug. 7, 2012

(54) ISOLATION LAYER STRUCTURE, METHOD OF FORMING THE SAME AND METHOD OF MANUFACTURING A SEMICONDUCTOR DEVICE INCLUDING THE SAME

(75) Inventors: Ju-Wan Kim, Seongnam-si (KR); Kyu-Tae Na, Seoul (KR); Min Kim, Seoul (KR); Seung-Bae Park, Yongin-si (KR); Il-Woo Kim, Hwaseong-si (KR); Dae-Young Kwak, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 13/204,829

(22) Filed: Aug. 8, 2011

(65) Prior Publication Data
US 2011/0298036 A1    Dec. 8, 2011

Related U.S. Application Data

(62) Division of application No. 12/944,923, filed on Nov. 12, 2010, now Pat. No. 8,017,495.

(30) Foreign Application Priority Data

Nov. 12, 2009    (KR) .................. 10-2009-0108912

(51) Int. Cl.
*H01L 29/788*    (2006.01)
*H01L 21/762*    (2006.01)

(52) U.S. Cl. .............. 257/506; 257/E29.3; 257/E21.548
(58) Field of Classification Search ................ 257/499, 257/506, 510, E21.548, E29.3; 438/427, 438/428
See application file for complete search history.

(56) References Cited

U.S. PATENT DOCUMENTS 6,140,207 A * 10/2000 Lee .................... 438/427

FOREIGN PATENT DOCUMENTS

| KR | 20070001421 | 1/2007 |
|---|---|---|
| KR | 20070002550 | 1/2007 |
| KR | 20070063821 | 6/2007 |

* cited by examiner

*Primary Examiner* — Julio J Maldonado
*Assistant Examiner* — Daniel Shook
(74) *Attorney, Agent, or Firm* — Stanzione & Kim, LLP

(57) ABSTRACT

An isolation layer structure includes first to fourth oxide layer patterns. The first and third oxide layer patterns are sequentially formed in a first trench defined by a first recessed top surface of a substrate and sidewalls of gate structures on the substrate in a first region. The first trench has a first width, and the first and third oxide layer patterns have no void therein. The second and fourth oxide layer patterns are sequentially formed in a second trench defined by a second recessed top surface of the substrate and sidewalls of gate structures on the substrate in a second region. The second trench has a second width larger than the first width, and the fourth oxide layer pattern has a void therein.

13 Claims, 10 Drawing Sheets

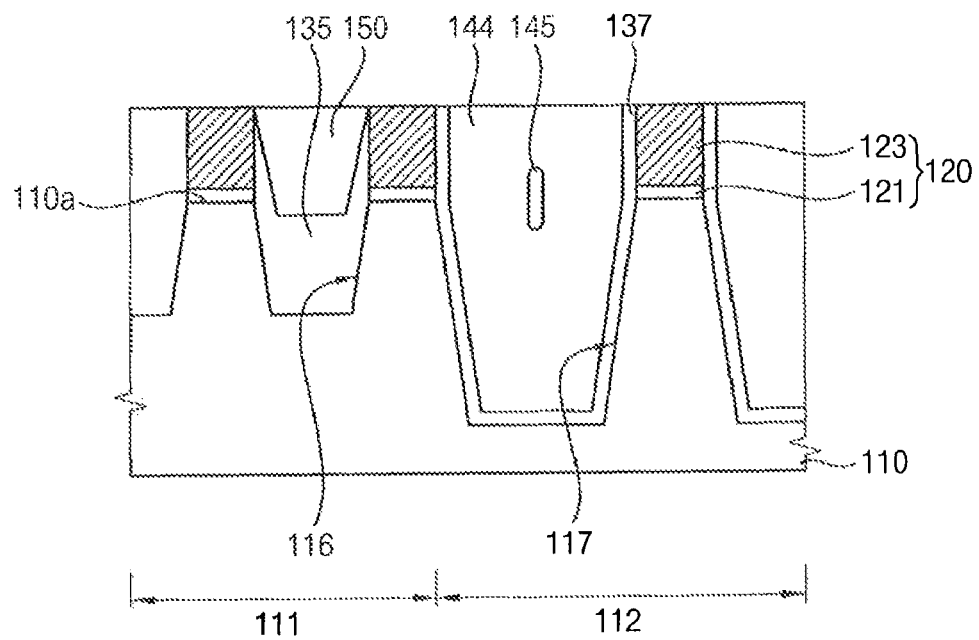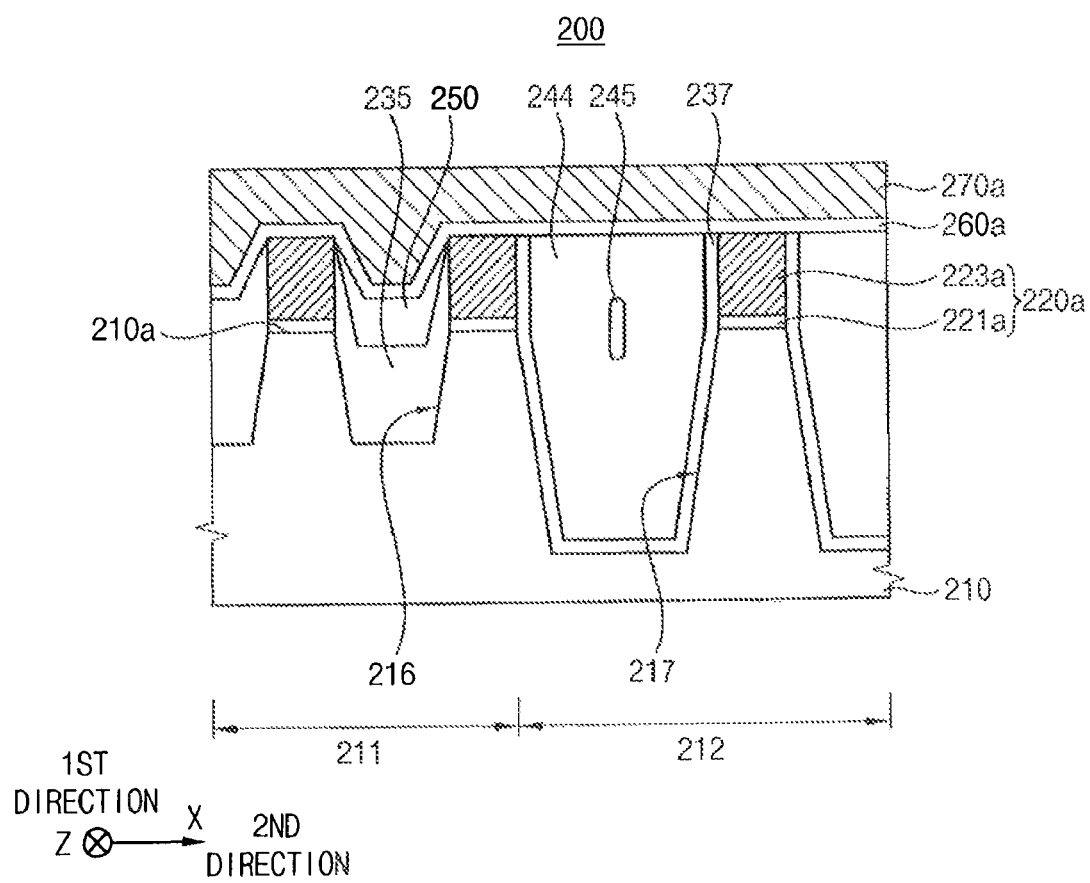

FIG. 10C
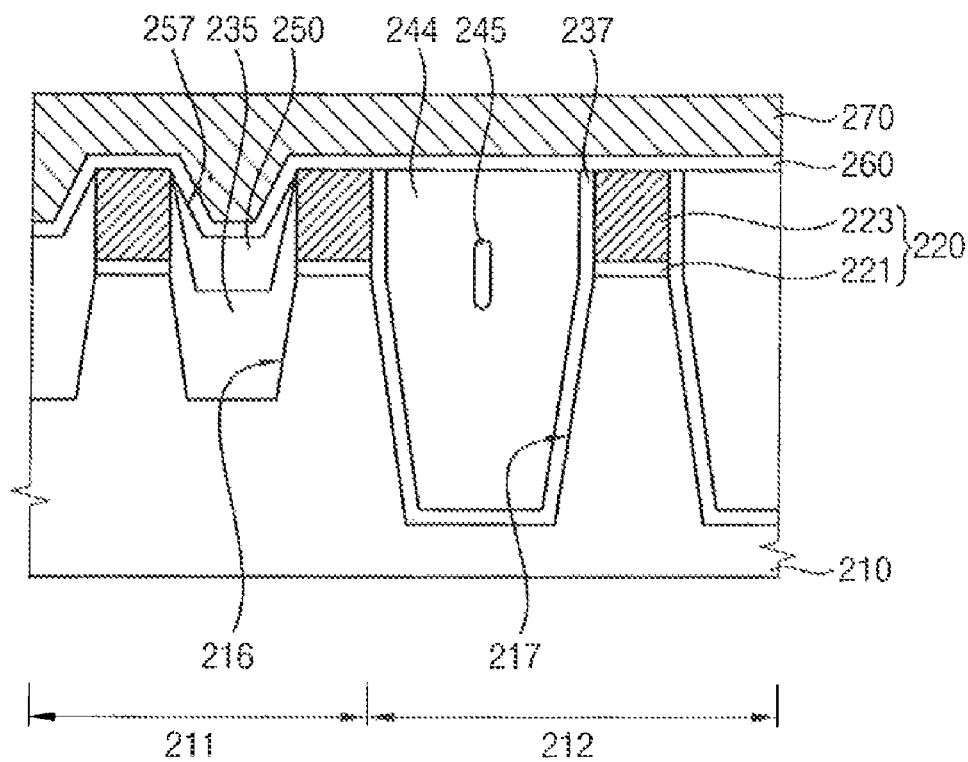

ISOLATION LAYER STRUCTURE, METHOD OF FORMING THE SAME AND METHOD OF MANUFACTURING A SEMICONDUCTOR DEVICE INCLUDING THE SAME

CROSS-REFERENCE TO RELATED APPLICATIONS

This application is a Divisional Application of prior U.S. application Ser. No, 12/944,923, filed on Nov. 12, 2010 now U.S. Pat. No. 8,017,495 in the United States Patent and Trademark, which claims the benefit of priority under 35 USC §119 to Korean Patent Application No. 2009-0108912, filed on Nov. 12, 2009 in the Korean Intellectual Property Office (KIPO), the contents of which are incorporated by reference herein in their entirety.

BACKGROUND

1. Field of the Invention

Example embodiments relate to an isolation layer structure, a method of forming the same and a method of manufacturing a semiconductor device including the same.

2. Description of the Related Art

Semiconductor memory devices may include volatile memory devices, e.g., a dynamic random access memory (DRAM) device or a static random access memory (SRAM) device, and non-volatile memory devices, e.g., read only memory (ROM) devices, electrically erasable and programmable read only memory (EEPROM) devices, or flash memory devices. The flash memory devices may control input or output of data by channel hot electron (CHE) injection or Fowler-Nordheim tunneling (F-N tunneling).

Generally, a unit cell of the non-volatile memory device may have a stacked structure in which a tunnel insulation layer, a floating gate, a dielectric layer and a control gate are sequentially stacked on a substrate. A plurality of unit cells may be separated from each other by an isolation layer. Particularly, a trench may be formed on an upper portion of the substrate between the unit cells. An insulative material may be filled into the trench, and a heat treatment may be performed on the insulative material to form the isolation layer. During the heat treatment, the isolation layer may expand/shrink so that dislocations may be generated at a portion of the substrate adjacent to the isolation layer. Due to the dislocations of the substrate, electrical characteristics of the non-volatile memory device may deteriorate.

SUMMARY

Example embodiments provide an isolation layer structure.

Example embodiments provide a method of forming an isolation structure.

Example embodiments provide a semiconductor device including an isolation layer structure.

Example embodiments provide a method of manufacturing a semiconductor device including an isolation layer structure.

Additional aspects and utilities of the present general inventive concept will be set forth in part in the description which follows and, in part, will be obvious from the description, or may be learned by practice of the present general inventive concept.

Features and/or utilities of the present general inventive concept may be realized by an isolation layer structure that includes first to fourth oxide layer patterns. The first and third oxide layer patterns may be sequentially formed in a first trench defined by a first recessed top surface of a substrate and sidewalls of gate structures on the substrate in a first region. The first trench may have a first width, and the first and third oxide layer patterns may have no void therein. The second and fourth oxide layer patterns may be sequentially formed in a second trench defined by a second recessed top surface of the substrate and sidewalls of gate structures on the substrate in a second region. The second trench may have a second width larger than the first width, and the fourth oxide layer pattern may have a void therein.

The fourth oxide layer pattern may include an oxide having an expansion/shrinkage rate of less than about 5% at a temperature of about 900 to 1,000° C.

The first and third oxide layer patterns may include a middle temperature oxide, and the second and fourth oxide layer patterns may include undoped silicate glass.

The first and third oxide layer patterns may include a middle temperature oxide, and the second and fourth oxide layer patterns may include a high density plasma chemical vapor deposition (HDP-CVD) oxide.

The first and second oxide layer patterns may cover inner walls of the first and second trenches, respectively.

Each of the gate structures may include a tunnel insulation layer pattern and a floating gate sequentially stacked on the substrate.

Features and/or utilities of the present general inventive concept may also be realized by a method of forming an isolation layer structure in which upper portions of a substrate are removed using gate structures thereon as an etching mask to form first and second trenches in first and second regions, respectively. The first and second trenches may be defined by recessed top surfaces of the substrate and sidewalls of the gate structures. The first trench may have a first width, and the second trench may have a second width larger than the first width. First and second oxide layer patterns may be formed on inner walls of the first and second trenches, respectively. The first oxide layer pattern may partially fill the first trench and may have no void therein. Third and fourth oxide layer patterns may be formed on the first and second oxide layer patterns, respectively. The third oxide layer pattern may fill a remaining portion of the first trench and may have no void therein, and the fourth oxide layer pattern may fill a remaining portion of the second trench and may have a first void therein.

A heat treatment may be further performed on the first to fourth oxide layer patterns, and the fourth oxide layer pattern may include an oxide having an expansion/shrinkage rate of less than about 5% at a temperature of about 900 to 1,000° C.

The first and second oxide layer patterns may be formed by performing a middle temperature oxidation process The third and fourth oxide layer patterns may be formed using undoped silicate glass The third and fourth oxide layer patterns may be formed using high density plasma chemical vapor deposition (HDP-CVD) oxide.

A first oxide layer may be formed on the inner walls of the first and second trenches, and the first oxide layer may entirely fill the first trench, partially fill the second trench, and may have a second void in the first trench. A second oxide layer may be formed on the first oxide layer, and the second oxide layer may entirely fill a remaining portion of the second trench and may have the second void in the second trench. Upper portions of the first and second oxide layers may be planarized until a top surface of the gate structures is exposed to form a preliminary first oxide layer pattern and the second oxide layer pattern in the first and second trenches, respectively. The preliminary first oxide layer pattern may entirely fill the first trench. An upper portion of the preliminary first oxide layer pattern may be removed to form the first oxide layer pattern having no void therein.

A third oxide layer may be formed on the first oxide layer pattern to fill a remaining portion of the first trench not filled by the first oxide layer pattern. An upper portion of the third oxide layer may be planarized until the top surface of the gate structure is exposed.

The upper portions of the first and second oxide layers may be planarized by forming the fourth oxide layer pattern on the second oxide layer pattern.

Features and/or utilities of the present general inventive concept may also be realized by a method of manufacturing a semiconductor device in which a plurality of gate structures is formed on a substrate divided into first and second regions, and each gate structure may include a tunnel insulation layer pattern and a floating gate sequentially stacked on the substrate. Upper portions of the substrate may be removed using the gate structures as an etching mask to form first and second trenches in the first and second regions, respectively. The first and second trenches may be defined by recessed top surfaces of the substrate and sidewalls of the gate structures. The first trench may have a first width, and the second trench may have a second width larger than the first width. First and second oxide layer patterns may be formed on inner walls of the first and second trenches, respectively. The first oxide layer pattern may partially fill the first trench and may have no void therein. Third and fourth oxide layer patterns may be formed on the first and second oxide layer patterns, respectively. The third oxide layer pattern may fill a remaining portion of the first trench and may have no void therein, and the fourth oxide layer pattern may fill a remaining portion of the second trench and may have a first void therein. An upper portion of the third oxide layer pattern may be removed to form a recess. A dielectric layer pattern may be formed on the second, third, and fourth oxide layer patterns and the gate structures. A control gate may be formed on the dielectric layer.

A heat treatment may be further performed on the first to fourth oxide layer patterns, and the fourth oxide layer pattern may be formed using an oxide having an expansion/shrinkage rate of less than about 5% at a temperature of about 900 to 1,000° C.

The first and second oxide layer patterns may be formed by performing a middle temperature oxidation process.

The third and fourth oxide layer patterns may be formed using undoped silicate glass.

The third and fourth oxide layer patterns may be formed by an HDP-CVD process.

A first oxide layer may be formed on the inner walls of the first and second trenches. The first oxide layer may entirely fill the first trench, partially fill the second trench, and have a second void in the first trench. A second oxide layer may be formed on the first oxide layer, and the second oxide layer may entirely fill a remaining portion of the second trench and have the first void in the second trench. Upper portions of the first and second oxide layers may be planarized until a top surface of the gate structures is exposed to form a preliminary first oxide layer pattern and the second oxide layer pattern in the first and second trenches, respectively. The preliminary first oxide layer pattern may entirely fill the first trench. An upper portion of the preliminary first oxide layer pattern may be removed to form the first oxide layer pattern having no void therein.

A fourth oxide layer pattern filling a second trench having a relatively large width may have a void therein. In a subsequent heat treatment process, the fourth oxide layer pattern may relieve stress caused by thermal mismatch between the oxide layer pattern and the substrate, thereby improving structural stability. For example, dislocations may not occur in a portion of the substrate adjacent to the fourth oxide layer pattern, or devices on the substrate may not lean.

Features and/or utilities of the present general inventive concept may also include an isolation layer structure including a substrate having a first trench and a second trench, the first trench having a width less than the width of the second trench, a first oxide layer pattern to fill only a portion of the first trench, a second oxide layer pattern to fill only a portion of the second trench, a third oxide layer pattern to fill a portion of the first trench not filled by the first oxide layer pattern, each of the first and third oxide layer patterns having no void therein, and a fourth oxide layer pattern to fill an entire portion of the second trench not filled by the second oxide layer, the fourth oxide layer having at least one void therein.

The isolation layer structure may further include a gate structure including a tunnel isolation layer formed on the substrate and a floating gate formed on the tunnel isolation layer, and the gate structure may form a portion of a side wall of each of the first and second trenches.

The isolation structure may further include a dielectric layer pattern formed on the gate structure and a control gate formed on the dielectric pattern.

The gate structure may include a plurality of gate structures arranged in at least one line along a first axis, the first and second trenches extend through the substrate parallel to a second axis perpendicular to the first axis, and the dielectric layer pattern and the control gate extend across the plurality of gate structures along the first axis.

The first oxide layer may include side portions adjacent to the side walls, and the side portions increase in thickness in a direction from an open end of the first trench toward a base of the trench.

The second oxide layer pattern has a substantially uniform thickness.

The first trench may have a depth less than a depth of the second trench.

Features and/or utilities of the present general inventive concept may also include a method of forming an isolation layer structure including forming first and second trenches in a substrate, the first trench having a width less than a width of the second trench, forming a first oxide layer pattern in the first trench to fill only a portion of the first trench, forming a second oxide layer pattern in the second trench to fill only a portion of the second trench, forming a third oxide layer pattern in the first trench on the first oxide layer pattern to fill a portion of the first trench not filled by the first oxide layer pattern, the first and third oxide layer patterns having no voids therein, and forming a fourth oxide layer pattern in the second trench on the second oxide layer pattern to fill a portion of the second trench not filled by the second oxide layer pattern, the fourth oxide layer pattern having a void therein.

The method may further include, before forming the first and second oxide layer patterns, forming at least one gate structure on an upper surface of the substrate to define side walls of the first and second trenches.

Forming a gate structure may include forming a tunnel insulation pattern on an the upper surface of the substrate, and forming a floating gate on the tunnel insulation pattern.

Forming the gate structure may include forming a plurality of gate structures arranged in at least one line in a first direction, and the method further may include forming a control gate to extend in the first direction to connect each of the plurality of gate structures.

The method may further include forming a dielectric layer pattern between the plurality of gate structures and the control gate.

The first and second trenches may be formed to extend parallel to each other in a second direction that crosses the first direction.

Forming the first and second oxide layer patterns may include applying a first single oxide layer simultaneously to each of the first and second trenches.

Applying the first single oxide layer to each of the first and second trenches further may include applying the first single oxide layer to an upper surface of a wall between the first and second trenches.

Forming the third and fourth oxide layer patterns may include forming a second single oxide layer on the first single oxide layer, and the method further may include planarizing portions of the first and second same oxide layers located on the upper surface of the wall between the first and second trenches to form a planar surface including at least portions of the wall between the first and second trenches, the first single oxide layer, and the second single oxide layer.

Forming the third oxide layer pattern may include forming a recess in the first single oxide layer located in the first trench, and filling the recess with the third oxide layer pattern.

Applying the first single oxide layer may include forming a void in the first trench, and forming the recess in the first single oxide layer may include removing the portion of the first single oxide layer in the first trench surrounding the void in the first trench.

Features and/or utilities of the present general inventive concept may include an electronic device including memory and a controller to control access to the memory. The memory may include an isolation layer structure including a substrate having a first trench and a second trench, the first trench having a width less than the width of the second trench, a first oxide layer pattern to fill only a portion of the first trench, a second oxide layer pattern to fill only a portion of the second trench, a third oxide layer pattern to fill a portion of the first trench not filled by the first oxide layer pattern, each of the first and third oxide layer patterns having no void therein, and a fourth oxide layer pattern to fill an entire portion of the second trench not filled by the second oxide layer, the fourth oxide layer having at least one void therein.

BRIEF DESCRIPTION OF THE DRAWINGS

Example embodiments will be more clearly understood from the following detailed description taken in conjunction with the accompanying drawings. FIGS. 1 to 14 represent non-limiting, example embodiments as described herein.

Figure 1:
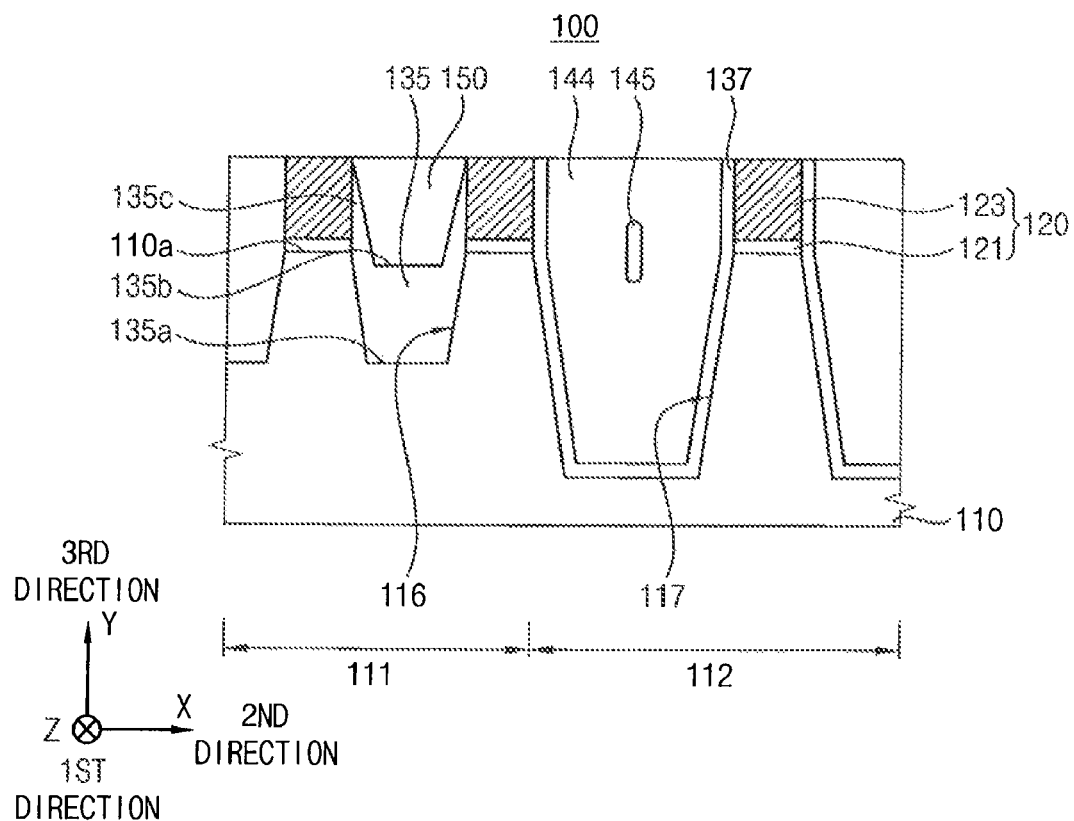

The above and/or other aspects of the present general inventive concept will become apparent and more readily appreciated from the following description of the exemplary embodiments, taken in conjunction with the accompanying drawings, in which:

FIG. 1 is a cross-sectional view illustrating an isolation layer structure in accordance with example embodiments.

FIGS. 2 to 7 are cross-sectional views illustrating a method of forming an isolation layer structure in accordance with example embodiments.

Figure 8B:
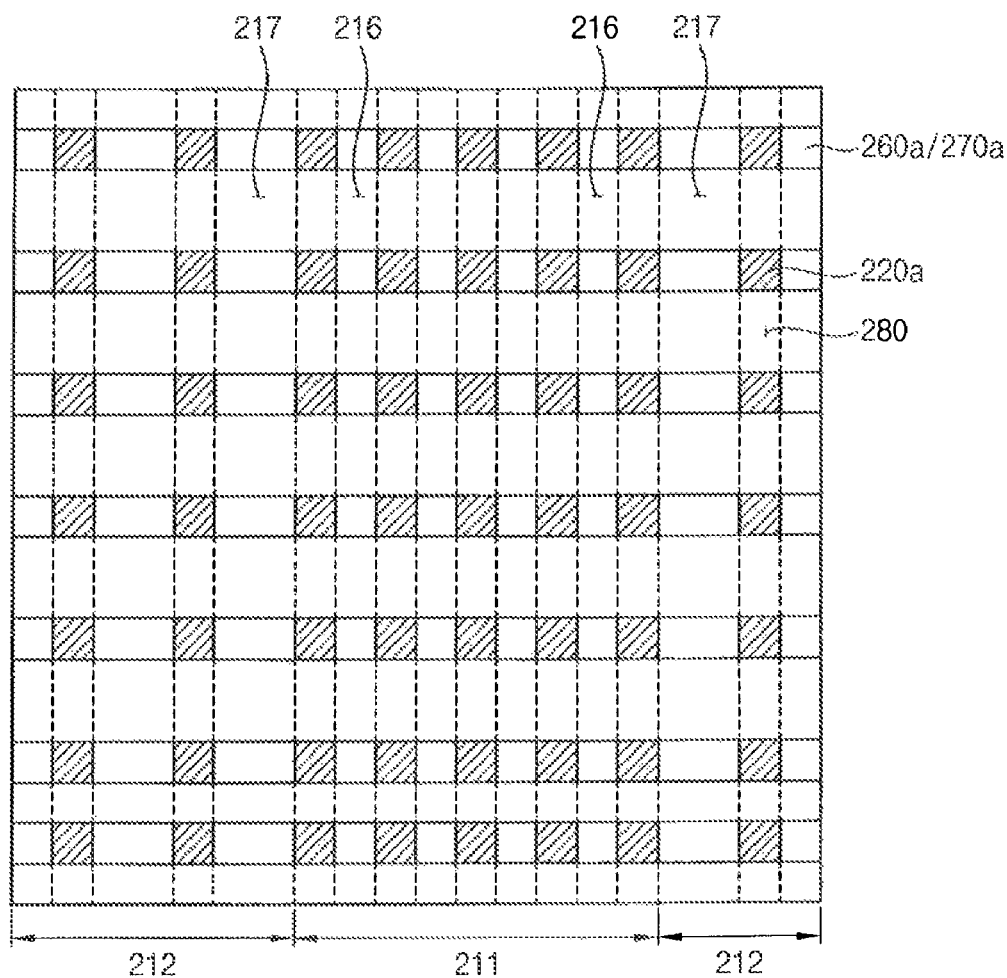
Figure 9:
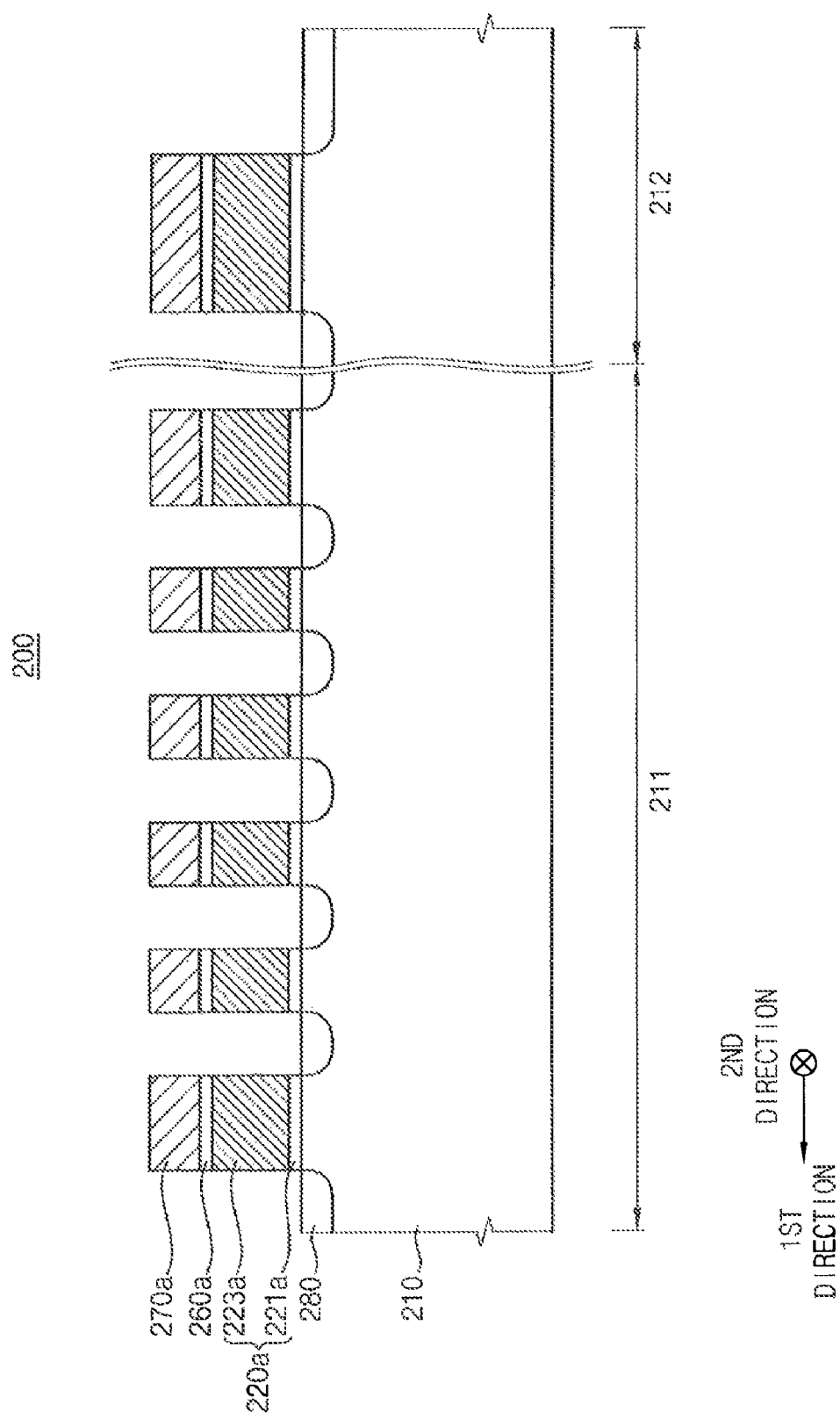

FIGS. 8A, 8B, and 9 are cross-sectional and plan views illustrating a semiconductor device in accordance with example embodiments.

Figure 10A:
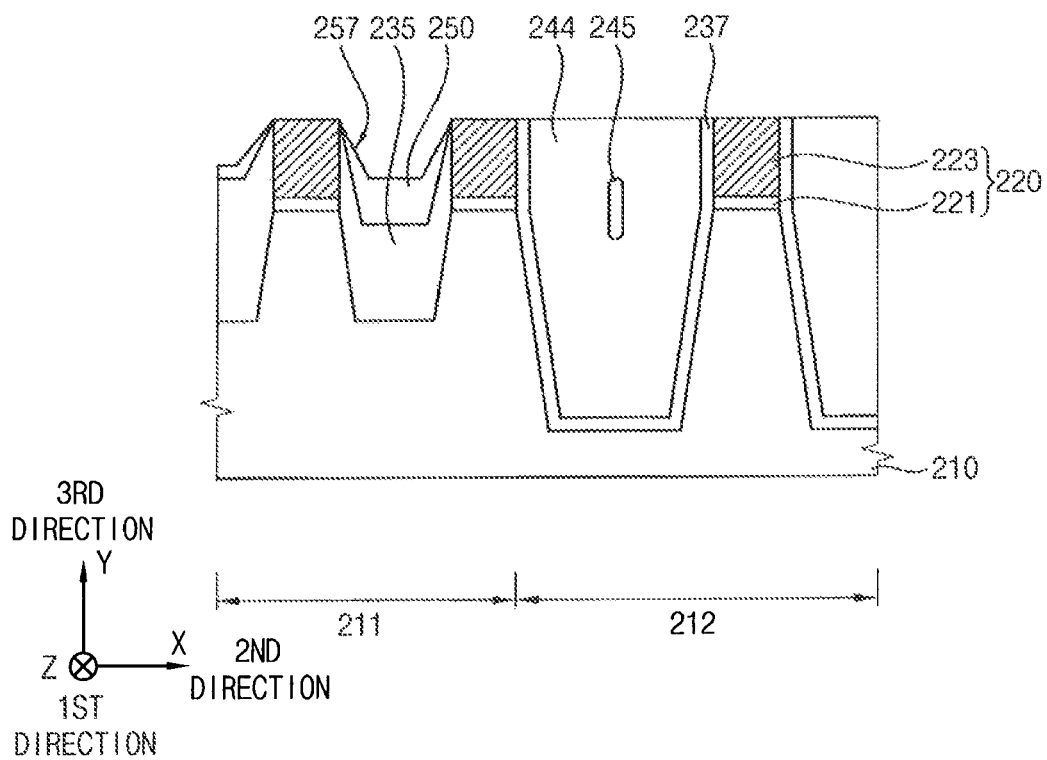
Figure 10B:
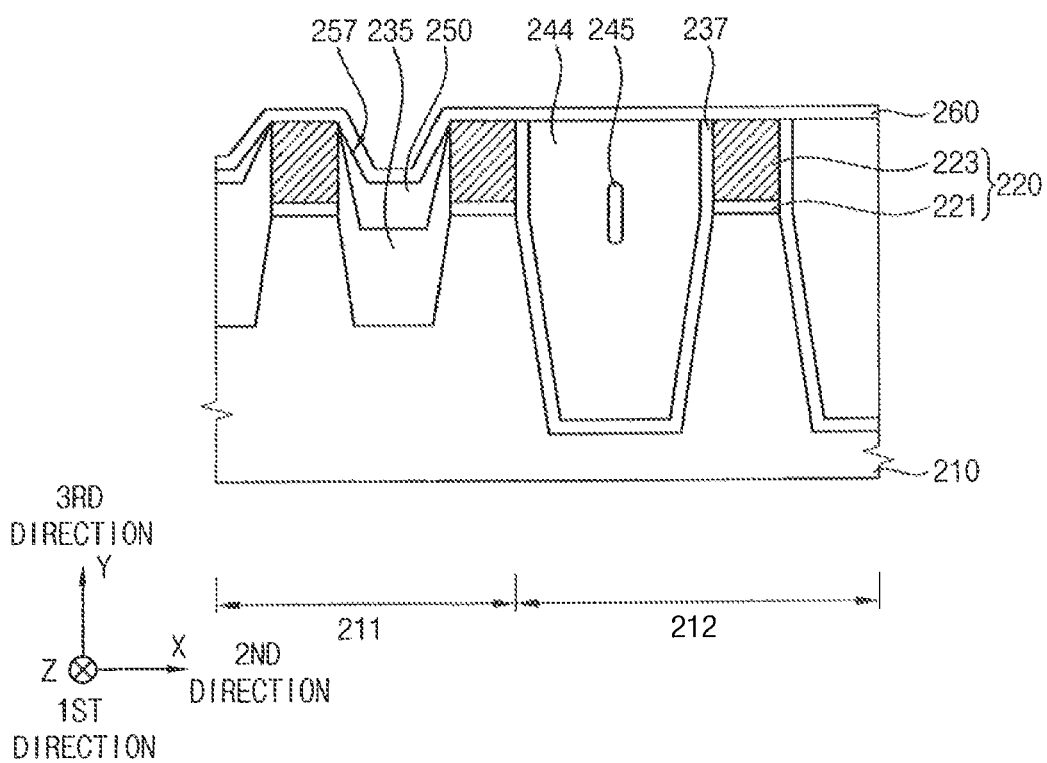

FIGS. 10A to 10C are cross-sectional views illustrating a method of manufacturing a semiconductor device in accordance with example embodiments.

Figure 11:
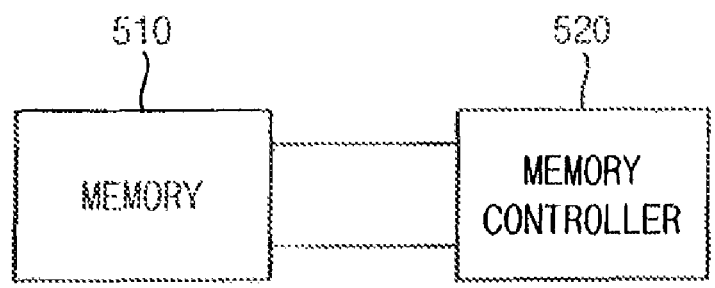

FIG. 11 is a block diagram illustrating an electronic device including a non-volatile semiconductor device in accordance with some embodiments.

Figure 12:
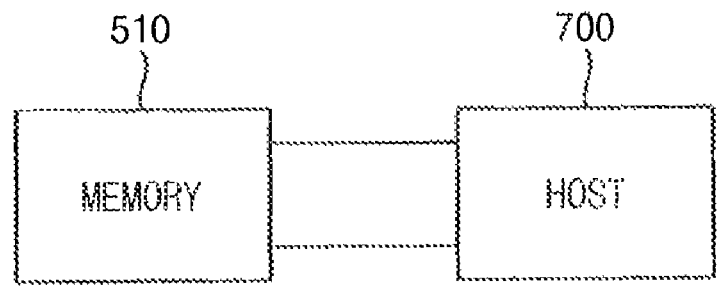

FIG. 12 is a block diagram illustrating an electronic device including a non-volatile semiconductor device in accordance with some embodiments.

Figure 13:
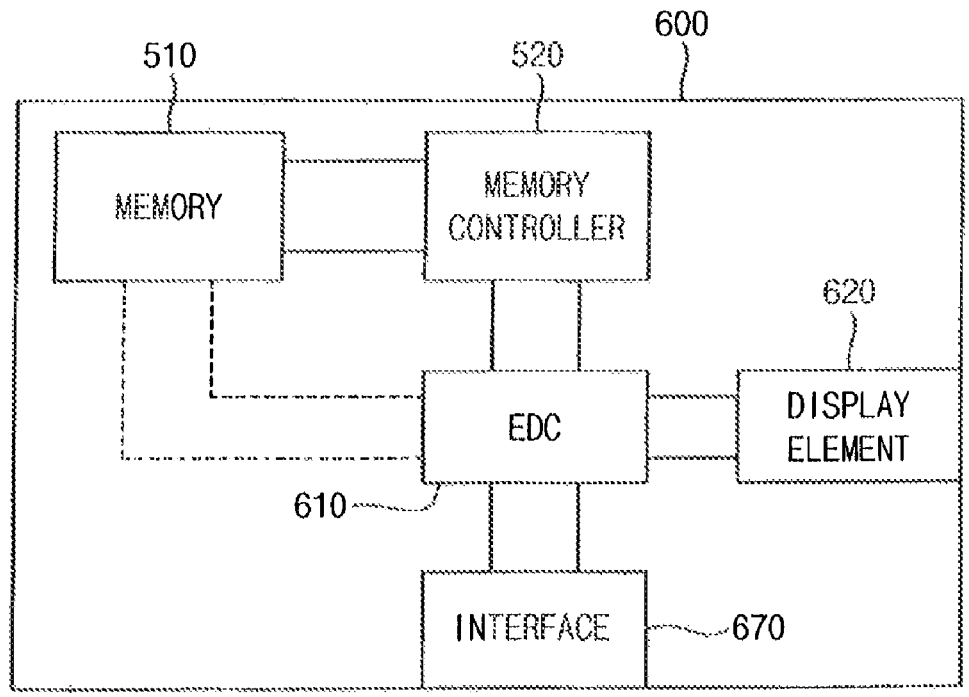

FIG. 13 is a block diagram illustrating an electronic device including a non-volatile semiconductor device in accordance with some embodiments.

Figure 14:
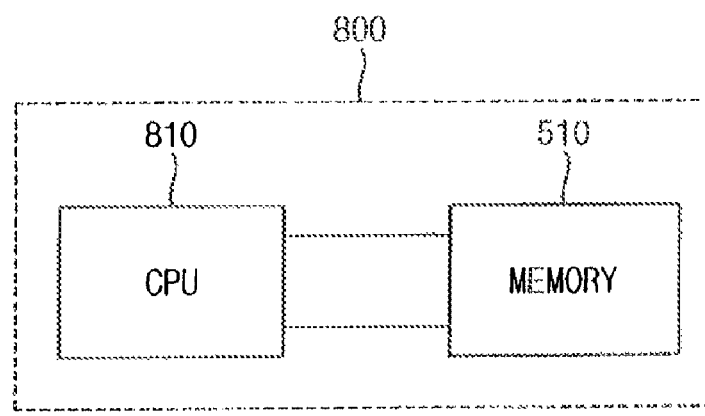

FIG. 14 is a block diagram illustrating an electronic device including a non-volatile semiconductor device in accordance with some embodiments.

DETAILED DESCRIPTION OF THE EMBODIMENTS

Various example embodiments will be described more fully hereinafter with reference to the accompanying drawings, in which some example embodiments are shown. The present inventive concept may, however, be embodied in many different forms and should not be construed as limited to the example embodiments set forth herein. Rather, these example embodiments are provided so that this description will be thorough and complete, and will fully convey the scope of the present inventive concept to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element or features relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present general inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be explained in detail with reference to the accompanying drawings.

FIG. 1 is a cross-sectional view illustrating an isolation layer structure in accordance with example embodiments of the present general inventive concept.

Referring to FIG. 1, the isolation layer structure 100 may include first to fourth oxide layer patterns 135, 137, 150 and 144 on a substrate 110 having a plurality of gate structures 120 thereon.

The substrate 110 may be divided into a first region 111 and a second region 112. The first region 111 may serve as a memory cell region in which memory cells of a non-volatile memory device may be formed, and the second region 112 may serve as a peripheral region in which peripheral circuits may be formed. The substrate 110 may include a semiconductor substrate, e.g., a silicon substrate or a germanium substrate, a substrate including a semiconductor layer, e.g., a silicon-on-insulator (SOI) substrate or a germanium-on-insulator (GOI) substrate, a metal oxide substrate, and the like.

The plurality of gate structures 120 may be spaced apart from each other on the substrate 110. In an example embodiment, each of the gate structures 120 may include a tunnel insulation layer pattern 121 and a floating gate 123 sequentially stacked on the substrate 110. The tunnel insulation layer pattern 121 may include silicon oxide, and the floating gate 123 may include a conductive material, e.g., doped polysilicon, a metal, etc.

A first trench 116 having a first width and a first depth may be defined as a space by a recessed top surface of the substrate 110 in the first region 111 together with sidewalls of the gate structures 120. A second trench 117 having a second width and a second depth may be defined as a space by a recessed top surface of the substrate 110 in the second region 112 together with sidewalls of the gate structures 120. The second width and depth may be larger than the first width and depth.

Alternatively, the first and second trenches 116 and 117 may be defined as spaces only by the recessed top surfaces of the substrate 110. That is, the first trench 116 may be defined as a space only by the recessed top surface of the substrate 110 in the first region 111, and the second trench 117 may be defined as a space only by the recessed top surface of the substrate 110 in the second region 112. In this case, the gate structures 120 may not be formed on the substrate 110.

Hereinafter, only the trenches 116 and 117 defined as the spaces by the recessed top surfaces of the substrate 110 together with the sidewalls of the gate structures 120 are illustrated for the convenience of explanation.

The first oxide layer pattern 135 partially filling the first trench 116 may be formed on the inner wall of the first trench 116. The first oxide layer pattern 135 may have no void or seam therein, and may include an oxide. The first oxide layer pattern 135 may have a bottom surface 135$a$ substantially lower than a top surface 110$a$ of the substrate 110. The first oxide layer pattern 135 may have a tapered width, i.e., the width thereof may decrease as the height decreases in the direction Y. In other words, a thickness of the side portion 135$c$ of the first oxide layer pattern 135 may be less at a top-most portion of the first oxide pattern layer 135 than at a point where the side portion 135$c$ meets the bottom 135$b$ of the recess in the first oxide layer pattern 135. In addition, the thickness of the first oxide layer pattern 135 may gradually increase between the top-most portion of the first oxide pattern layer 135 and the point where the side portion 135$c$ meets the bottom 135$b$ of the recess in the first oxide layer pattern 135.

In some embodiments, the first oxide layer pattern 135 may include a middle temperature oxide. In other embodiments, the first oxide layer pattern 135 may include an atomic layer deposition (ALD) oxide.

The first oxide layer pattern 135 may have no void or seam therein, and thus may electrically insulate the gate structures 120 from each other very well. When the first trench 116 has a first width less than about 20 nm, a void or a seam in the first oxide layer pattern 135 may deteriorate the insulation characteristics of the first oxide layer pattern 135. Thus, the first oxide layer pattern 135 having no void or seam may have improved insulation characteristics.

The third oxide layer pattern 150 may be formed on the first oxide layer pattern 135, and may fill a remaining portion of the first trench 116 that is unfilled by the first oxide layer 135. The third oxide layer pattern 150 together with the first oxide layer pattern 135 may insulate the gate structures 120 from each other on the substrate 110 in the first region 111.

In some embodiments, the third oxide layer pattern 150 may entirely fill the portion of the trench 116 unfilled by the first oxide layer pattern 135. In other embodiments, the third oxide layer pattern 150 may have a concave top surface, and thus may not entirely fill the trench 116.

In some embodiments, the third oxide layer pattern 150 may include undoped silicate oxide. In other embodiments, the third oxide layer pattern 150 may include a high density plasma chemical vapor deposition (HDP-CVD) oxide.

The second oxide layer pattern 137 may be formed on the inner wall of the second trench 117. The second oxide layer pattern 137 may have a thickness of about 50 to about 70 nm. The second oxide layer pattern 137 may include a material substantially the same as that of the first oxide layer pattern 135. In some embodiments, the first oxide layer pattern 135 may include a middle temperature oxide or an ALD oxide.

The fourth oxide layer pattern 144 may be formed on the second oxide layer pattern 137, and may fill a remaining portion of the second trench 117 unfilled by the second oxide layer pattern 137, however, the fourth oxide layer pattern 144 may have a void 145 therein. The fourth oxide layer pattern 144 may include a material substantially the same as that of the second oxide layer pattern 137. The second and fourth oxide layer patterns 137 and 144 may insulate the gate structures 120 from each other on the substrate 110 in the second region 112.

In an example embodiment, the void 145 may extend vertically along the axis Y in the fourth oxide layer pattern 144. A vertical length of the void 145 may vary according to a slope of the second trench 117 and process conditions for forming the fourth oxide layer pattern 144.

The void 145 may compensate thermal expansion of the fourth oxide layer pattern 144 that may occur during a subsequent heat treatment process. The fourth oxide layer pattern 144 formed in the second trench 117 may have a larger width and a larger depth than those of the first oxide layer pattern 135 and the third oxide layer pattern 150 formed in the first trench 116. Thus, the fourth oxide layer pattern 144 may expand more than the first and third oxide layer patterns 135 and 150 during the subsequent heat treatment process. In this case, the void 145 in the fourth oxide layer pattern 144 may serve as a buffer that may compensate the thermal expansion of the fourth oxide layer pattern 144 so that the fourth oxide layer pattern 144 in the second trench 117 may have improved thermal stability.

In some embodiments, the fourth oxide layer pattern 144 may include undoped silicate oxide. In other embodiments, the fourth oxide layer pattern 144 may include an HDP-CVD oxide.

In some embodiments, the fourth oxide layer pattern 144 may include an oxide having an expansion/shrinkage rate of less than about 5% at a temperature of about 900 to 1000° C. Thus, the fourth oxide layer pattern 144 may have a relatively low expansion/shrinkage rate during the subsequent heat treatment process, and thus the fourth oxide layer pattern 144 may expand/shrink less so that dislocations may not occur at a portion of the substrate 110 adjacent to the fourth oxide layer pattern 144.

FIGS. 2 to 7 are cross-sectional views illustrating a method of forming an isolation layer structure in accordance with example embodiments.

Figure 2:
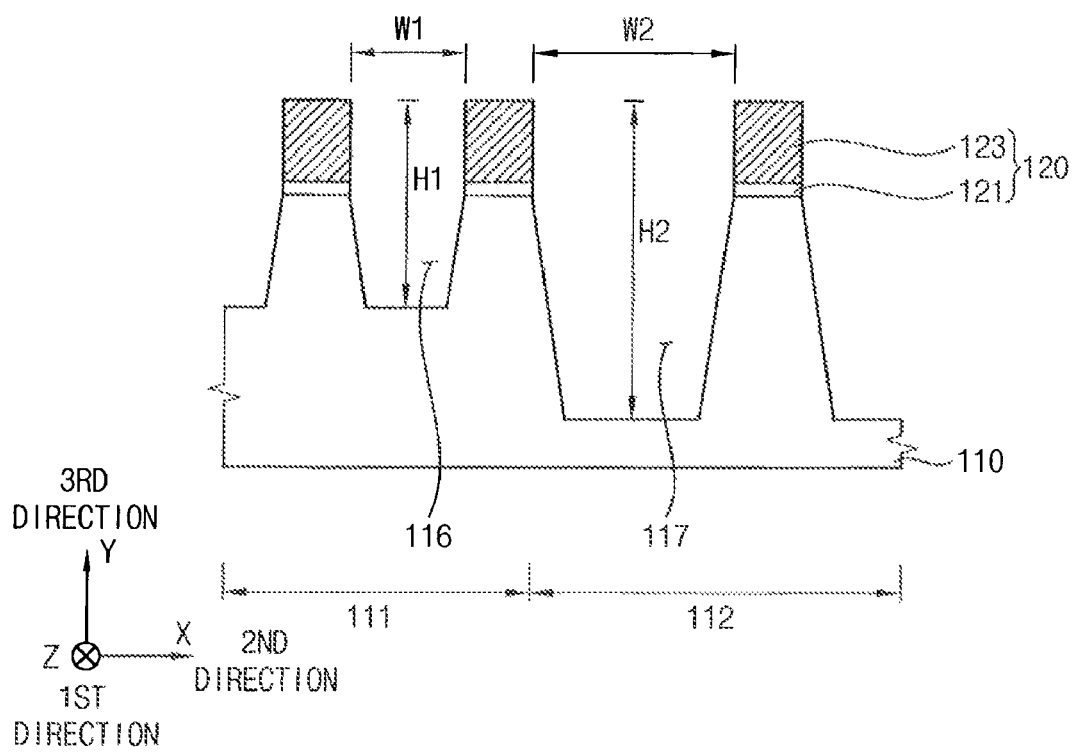

Referring to FIG. 2, a substrate 110 that may be divided into a first region 111 and a second region 112 may be provided. In some embodiments, the first region 111 may serve as a cell region that memory cells may be formed therein, and the second region 112 may serve as a peripheral region that peripheral circuits may be formed therein.

The substrate 110 may include a semiconductor substrate, e.g., a silicon substrate or a germanium substrate, a substrate including a semiconductor layer, e.g., a SOI substrate or a GOI substrate, a metal oxide substrate, and the like.

Gate structures 120 may be formed on the substrate 110 to be spaced apart from each other. A distance between the gate structures 120 on the substrate 110 in the first region 111 may determine a width of a first trench 116 that may be formed subsequently. A distance between the gate structures 120 on the substrate 110 in the second region 112 may determine a width of the second trench 117 that may be formed subsequently.

The gate structures 120 may include a floating gate 123 and a tunnel insulation layer pattern 121.

Particularly, a tunnel insulation layer may be formed on the substrate 110. The tunnel insulation layer may be formed by a thermal oxidation process. A floating gate layer may be formed on the tunnel insulation layer. The floating gate layer may be formed using polysilicon doped with impurities, a metal, etc.

The floating gate layer may be formed by a low pressure chemical vapor deposition (LPCVD) process. In some embodiments, a polysilicon layer may be formed on the tunnel insulation layer and impurities may be doped into the polysilicon layer in-situ. In other embodiments, an undoped polysilicon layer may be formed to a given thickness by an LPCVD process, and a doped polysilicon layer may be formed on the undoped polysilicon layer by an LPCVD process subsequently. In this case, the undoped polysilicon layer on the tunnel insulation layer may relieve the stress on the tunnel insulation layer when the floating gate layer is recrystallized.

The floating gate layer and the tunnel insulation layer may be partially etched to form the gate structures 120 each of which may include a tunnel insulation layer pattern 121 and a floating gate 123 sequentially stacked on the substrate 110.

Upper portions of the substrate 110 may be etched using the gate structures 120 as an etching mask to form first and second trenches 116 and 117 in the first and second regions 111 and 112, respectively. The first trench 116 may be formed to have a first width W1 substantially smaller than a second width W2 of the second trench 117. For example, the first trench 116 may have the first width W1 of less than about 30 nm, and the second trench 117 may have the second width W2 of more than about 60 nm.

As mentioned above, the first and second trenches 116 and 117 may be defined as spaces by recessed top surfaces of the substrate 110 together with sidewalls of the gate structures 120. Alternatively, the first and second trenches 116 and 117 may be defined as spaces only by the recessed top surfaces of the substrate 110, and the gate structures 120 may not be formed or may not be located adjacent to the trenches 116 and 117. Hereinafter, only the trenches 116 and 117 defined as the spaces by the recessed top surfaces of the substrate 110 together with the sidewalls of the gate structures 120 are illustrated for the convenience of explanation. The first and second trenches 116 and 117 may have a first height H1 and a second height H2, respectively, that may vary in accordance with desired characteristics of the gate structures 120. For example, the first height H1 of the first trench 116 may be substantially smaller than the second height H2 of the second trench 117. The first and second trenches 116 and 117 may extend in a first direction Z parallel to a top surface 110a of the substrate 110, and be spaced apart from each other in a second direction X perpendicular to the first direction Z and perpendicular to the top surface 110a of the substrate 110.

The first and second trenches 116 and 117 may be formed by a photolithography process. In some embodiments, an additional heat treatment may be performed on the trenches 116 and 117 to cure etching damages to the substrate 110 and/or the gate structures 120 generated in the etching process.

Figure 3:
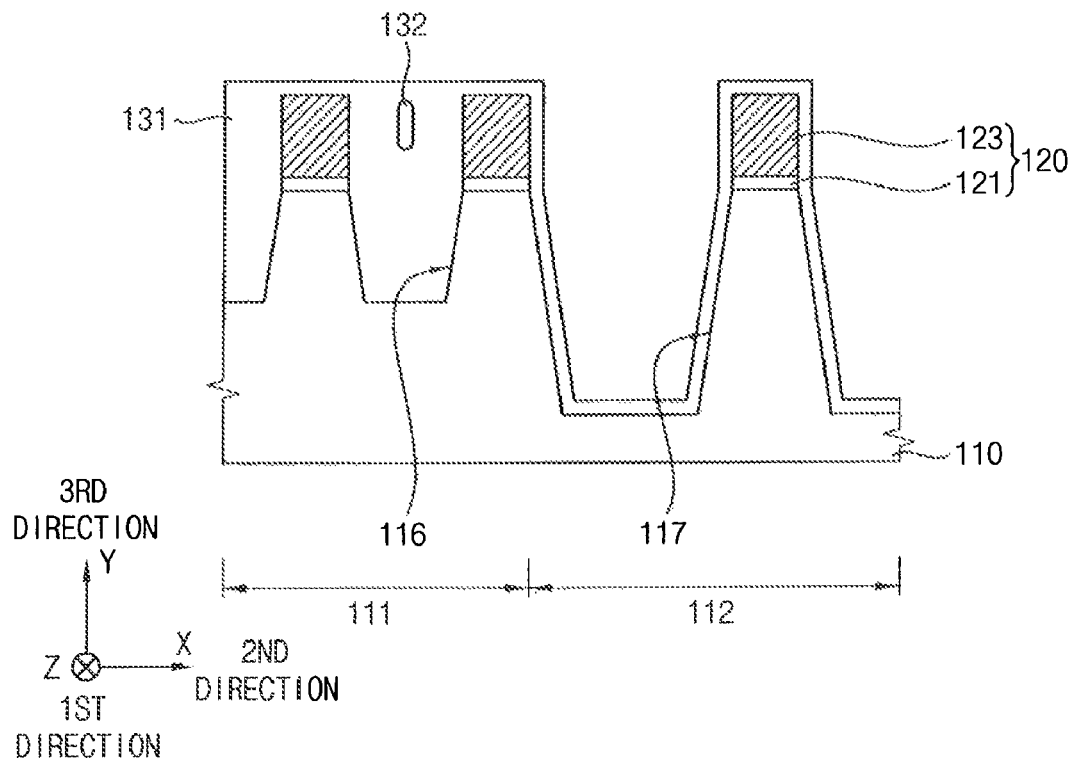

Referring to FIG. 3, a first oxide layer 131 may be formed on the substrate 110 and the gate structures 120 to entirely fill the first trench 116 and to partially fill the second trench 117. The second trench 117 may have the second width W2 and the second height H2 substantially larger than the first width W1 and the first height H1, and thus the first oxide layer 131 may not entirely fill the second trench 117 but may cover only an inner wall of the second trench 117, while the first oxide layer 131 may entirely fill the first trench 116. For example, when the first width W1 of the first trench 116 is about 20 to 30 nm, the first oxide layer 131 may be formed to a thickness of about 50 to 70 nm, so that the first oxide layer 131 may entirely fill the first trench 116 and partially fill the second trench 117 in the second region 112.

The first oxide layer 131 may have a first void 132 in the first trench 116. The first void 132 may be formed during the process of forming the first oxide layer 131, such as when the material forming the first oxide layer 131 is of an insufficient thickness to extend across the entire width of the first trench 116, for example. In the present specification and claims, a void is a pocket within a material, such as the first oxide layer 131 that is enclosed on all sides. The void is of a scale in at least nanometers in a width and height, and thickness. The first void 132 may deteriorate insulation characteristics of the first oxide layer 131 between adjacent gate structures 120 on the substrate 110 in the first region 111, and thus the first void 132 may be removed in a subsequent process. In some embodiments, the first oxide layer 131 may be formed using a silicon oxide.

In some embodiments, the first oxide layer 131 may be formed by a middle temperature oxidation process. Silane ($SiH_4$) gas or dichlorosilane ($SiH_2Cl_2$) gas may be used in the middle temperature oxidation process. The middle temperature oxidation process may be performed at a temperature of about 550 to 800° C. under a pressure of about 1 to 5 torr. In some embodiments, the above heat treatment for curing the etching damages and the middle temperature oxidation process may be performed in-situ.

When the first oxide layer 131 is formed by the middle temperature oxidation process, the first oxide layer 131 may be formed uniformly in the first and second trenches 116 and 117, so that less stress may be applied to the gate structures 120. Thus, the gate structures 120 adjacent to the first oxide layer 131 may be prevented from leaning. Specifically, a predetermined volume per unit of area of material comprising the first oxide layer 131 may be applied to the substrate 110 and the gate structures 120 in the vertical direction Y. Since the first trench 116 has a volume less than the second trench 117, the predetermined volume per unit area of the first oxide layer 131 may substantially fill the first trench 116 except for a void 132, while forming only a layer coating the side walls and bottom surface of the second trench 117.

In other embodiments, the first oxide layer 131 may be formed by an ALD process. The ALD process may be performed at a temperature of about 250 to 800° C. In the ALD process, silane, disilane, trisilane, tetraethylorthosilicate (TEOS), dichlorosilation (DSC), hexachlorosilane (HCP) and trisilaylamine (TSA) may serve as a silicon source gas.

The silicon source gas may be provided on the substrate 110 and may be attached to surfaces of the substrate 110 and the gate structures 120. Remaining silicon source gas that may not be attached to the surfaces of the substrate 110 and the gate structures 120 may be removed therefrom by a first purging gas. A reaction gas including oxygen ($O_2$), nitrous oxide ($N_2O$), ozone ($O_3$), water vapor ($H_2O$) and hydrogen peroxide ($H_2O_2$) may be provided on the substrate 110 and the gate structures 120 to be reacted with the silicon source gas attached to the surfaces of the substrate 110 and the gate structures 120, thereby forming the first oxide layer 131. The silicon source gas and the reaction gas remaining on the surfaces of the substrate 110 and the gate structures 120 may be removed therefrom by a second purging gas. A plurality of cycles including providing the silicon source gas, the first purging gas, the reaction gas and the second purging gas may be performed, so that the first oxide layer 131 may be formed to a desired thickness.

Even when the first trench 116 has a small first width W1 of about 20 nm, the first oxide layer 131 may fill the first trench 116 uniformly by the ALD process. Additionally, the first oxide 131 may apply a small stress on the gate structures 120 because the first oxide 131 may be formed uniformly in the first trench 116, thereby reducing the leaning of the gate structures 120 adjacent to the first oxide layer 131. Furthermore, when a second oxide layer 141 (see FIG. 4) that may be formed in a subsequent process has a dependency of a deposition rate on an underlayer, i.e., the first oxide layer 131, the deposition rate dependency of the second oxide layer 141 may be reduced by the first oxide layer 131 formed by an ALD process.

Figure 4:
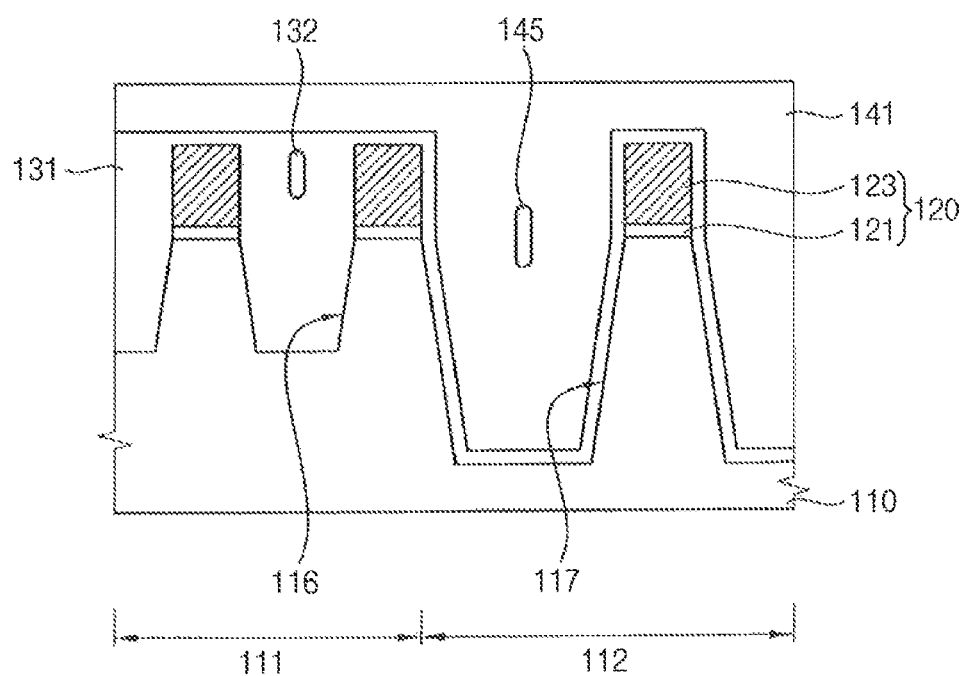

Referring to FIG. 4, the second oxide layer 141 may be formed on the first oxide layer 131 to entirely fill the second trench 117 not filled by the first oxide layer 131. The second oxide layer 141 in the second trench 117 may have one or more second voids 145.

In an example embodiment, the second oxide layer 141 may be formed to have a thickness of about 300 to 1,000 nm. When the second oxide layer 141 is formed to have a very large thickness greater than 1,000 nm, a planarization process for forming a fourth oxide layer pattern 144 (see FIG. 5) may not be performed easily. When the second oxide layer 141 is formed to have a very small thickness less than 300 nm, the second oxide layer 141 may not entirely till the second trench 117.

The second void 145 may extend in a third direction substantially vertical to an upper surface of the substrate 110. A vertical length of the second void 145 may vary in accordance with a slope of the second trench 117 and process conditions for forming the second oxide layer 141.

The second void 145 in the second oxide layer 141 may compensate thermal expansion of the second oxide layer 141 that may be generated during a subsequent heat treatment process. For example, a portion of the second oxide layer 141 in the second trench 117 may have a width larger than that of the first oxide layer 131 in the first trench 116. Thus, the portion of the second oxide layer 141 in the second trench 117 may expand/shrink more in a subsequent heat treatment process. In this case, the second void 145 remaining in the second oxide layer 141 may serve as a buffer that may compensate the thermal expansion of the second oxide layer 141. Thus, the portion of the second oxide layer 141 filling the second trench 117 may show improved thermal stability.

The second oxide layer 141 may be formed using an oxide having an expansion/shrinkage rate of less than about 5% at a temperature of about 900 to 1,000° C. Thus, the second oxide layer 151 may expand/shrink less, thereby preventing the generation of dislocations at a portion of the substrate 110 adjacent to the second oxide layer 141.

In some embodiments, the second oxide layer 141 may be formed using undoped silicate glass. When using undoped silicate glass, the second oxide layer 141 may be formed at a temperature of about 400 to 550° C. under a pressure of about 300 to 600 torr. When using undoped silicate glass, the second oxide layer 141 may be formed using ozone and TEOS as a reaction gas.

In other embodiments, the second oxide layer 141 may be formed by a high density plasma chemical vapor deposition (HDP-CVD) process.

Figure 5:
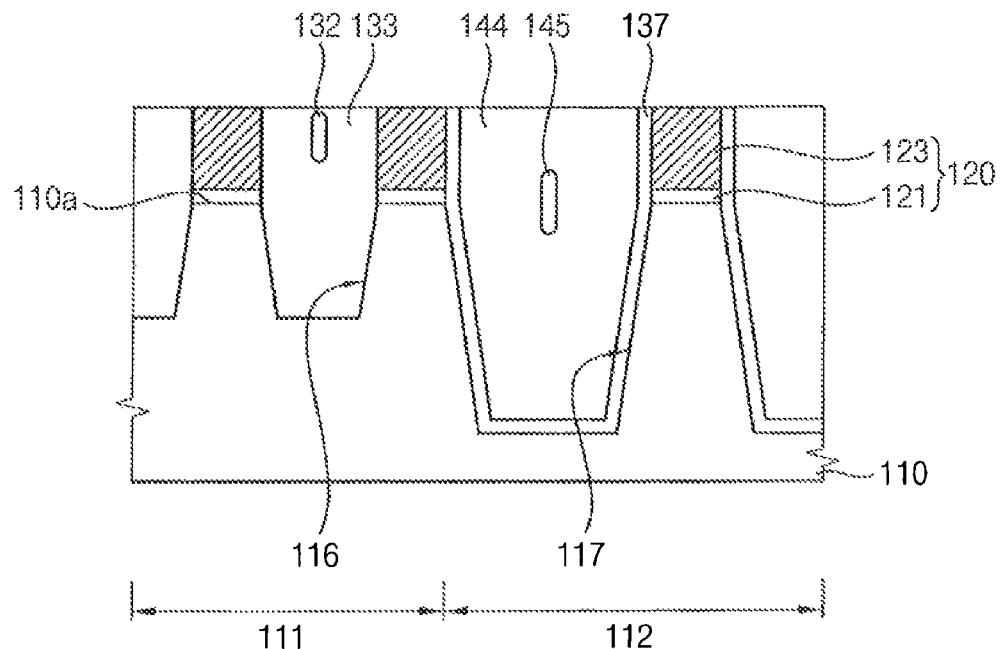

Referring to FIG. 5, upper portions of the first and second oxide layers 131 and 141 may be planarized until top surfaces of the gate structures 120 are exposed to form a preliminary first oxide layer pattern 133 in the first trench 116, and second and fourth oxide layer patterns 137 and 144 in the second trench 117. The preliminary first oxide layer pattern 133 may have the first void 132 therein, and the fourth oxide layer pattern 137 may have the second void 145 therein. The planarization process may include a chemical mechanical polishing (CMP) process. The CMP process may be performed using a grinding pad and a slurry.

Figure 6:
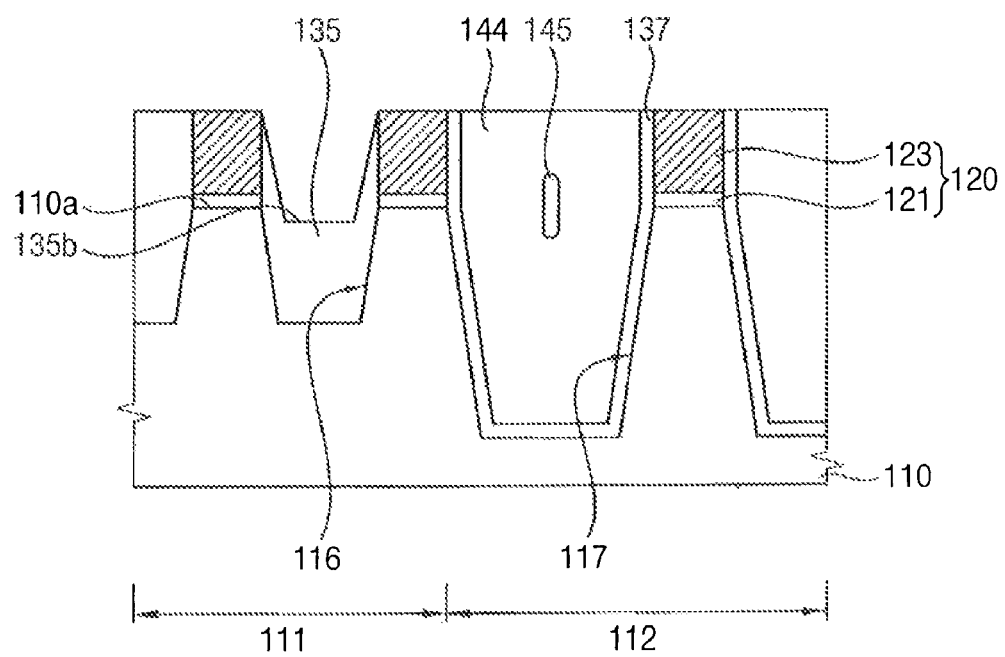

Referring to FIG. 6, an upper portion of the preliminary first oxide layer pattern 133 may be removed to form a first oxide layer pattern 135 that partially fills the first trench 116. The first void 132 in the preliminary first oxide layer pattern 133 may be removed by the etching process, so that the first oxide layer pattern 135 may have no void in the first trench 116.

The first oxide layer pattern 135 may be formed by an etch-back process. In an example embodiment, the first oxide layer pattern 135 may have a top surface 135b lower than the top surface 110a of the substrate 110, and the first void 132 may be completely removed by the etch-back process.

Referring to FIG. 7, a third oxide layer may be formed on the first, second and fourth oxide layer patterns 135, 137 and 144 and the gate structures 120 to entirely fill a remaining portion of the first trench 116. In some embodiment, the third oxide layer may be formed using undoped silicate glass or an HDP-CVD oxide. In some embodiments, the third oxide layer may be formed to have a thickness of about 20 to 50 nm.

An upper portion of the third oxide layer may be planarized until top surfaces of the gate structures 120 and the second and fourth oxide layer patterns 137 and 144 are exposed to form a third oxide layer pattern 150 on the first oxide layer pattern 135 in the first trench 116. Thus, the first oxide layer pattern 135 and the third oxide layer pattern 150 may entirely fill the first trench 116.

In some embodiments, an etch-back process and/or a cleaning process may be further performed on the third oxide layer pattern 150. In this case, a recess may be formed at an upper portion of the third oxide layer pattern 150.

After forming the first to fourth oxide layer patterns 135, 137, 144 and 150, a heat treatment may be performed. In some embodiments, the heat treatment may be performed at a temperature of about 900 to 1,000° C. When the fourth oxide layer pattern 144 includes the oxide having the low expansion/shrinkage rate of less than about 5%, the fourth oxide layer pattern 144 may expand shrink less, and the generation of dislocations at a portion of the substrate 110 adjacent to the fourth oxide layer pattern 144 may be prevented.

FIGS. 8A, 8B, and 9 are cross-sectional views and a plan view illustrating a semiconductor device in accordance with example embodiments. FIG. 8A is cross-sectional view taken along an extending direction of a control gate of the semiconductor device. FIG. 8B is a plan top view of a grid of gate structures 120, FIG. 9 is a cross-sectional view taken along an extending direction of an active region of the semiconductor device. Because first and third oxide layer patterns filling a first trench and second and fourth oxide layer patterns filling a second trench are substantially the same or very similar to those illustrated with reference to FIGS. 2 to 7, detailed explanations about the oxide layer patterns are omitted here.

Referring to FIGS. 8A to 9, the semiconductor device 200 may include first to fourth oxide layer patterns 235, 237, 250 and 244 on a substrate 210 having a plurality of gate structures 220a thereon, a dielectric layer pattern 260a and a control gate pattern 270a.

The plurality of gate structures 220a spaced apart from each other may be formed on a substrate 210 that may be divided into a first region 211 and a second region 212. In an example embodiment, each of the gate structures 220a may include a tunnel insulation layer pattern 221a and a floating gate 223a sequentially stacked on the substrate 210.

A first trench 216 may be defined as a space by a recessed top surface of the substrate 210 in the first region 211 together with sidewalls of the gate structures 220a. A second trench 217 may be defined as a space by a recessed top surface of the substrate 210 in the second region 212 together with sidewalls of the gate structures 220a. Alternatively, the first and second trenches 216 and 217 may be defined as spaces only by the recessed top surfaces of the substrate 210, and no gate structures 220a may be formed, or the gate structures 220a may not be formed adjacent to the first and second trenches 216 and 217. The first and second trenches 216 and 217 may extend in a first direction parallel to a top surface of the substrate 210, and be spaced apart from each other in a second direction perpendicular to the first direction.

The first oxide layer (not shown) may be formed on inner walls of the first and second trenches 216 and 217. The first oxide layer may entirely fill the first trench 216, and partially fill the second trench 217. The first oxide layer may have a first void (not shown) in the first trench 216.

The second oxide layer (not shown) may be formed on the first oxide layer. The second oxide layer may entirely fill a remaining portion of the second trench, and have a second void 245 in the second trench 217.

Upper portions of the first and second oxide layers may be planarized until a top surface of the gate structures 220a is exposed to form a preliminary first oxide layer pattern (not shown) and the second oxide layer pattern 237 in the first and second trenches, respectively.

The preliminary first oxide layer pattern may entirely fill the first trench. An upper portion of the preliminary first oxide layer pattern may be removed to form the first oxide layer pattern 235. The first oxide layer pattern 235 partially filling the first trench 216 may be formed in the inner wall of the first trench 216. The first oxide layer pattern 235 may have no void or seam therein, and may include an oxide. In an example embodiment, the first oxide layer pattern 235 may have a bottom surface substantially lower than a top surface of the substrate 210.

The third oxide layer pattern 250 may be formed on the first oxide layer pattern 235 and may fill a remaining portion of the first trench 216 not filled by the first oxide layer pattern 235. The third oxide layer pattern 230 may have a concave top surface, and may have a top surface substantially lower than a top surface of the gate structure 220a. The third oxide pattern 250 together with the first oxide layer pattern 235 may insulate the gate structures 220 from each other on the substrate 210 in the first region 211.

The second oxide layer pattern 237 may be formed on the inner wall of the second trench 217. The second oxide layer pattern 237 may have a thickness of about 50 to about 70 nm. The second oxide layer pattern 237 may include a material substantially the same as that of the first oxide layer pattern 235.

The fourth oxide layer pattern 244 may be formed on the second oxide layer pattern 237, and may fill a remaining portion of the second trench 217 not filled by the second oxide layer pattern 237, however, the fourth oxide layer pattern 244 may have a second void 245 therein. The second and fourth oxide layer patterns 237 and 244 may insulate the gate structures 220a from each other in the substrate 210 in the second region 212. The second void 245 may serve as a buffer that may compensate thermal expansion of the fourth oxide layer pattern 245 during a subsequent heat treatment process so that the fourth layer pattern 244 in the second trench 217 may have improved thermal stability. In some embodiments, the fourth oxide layer pattern 244 may include an oxide having an expansion/shrinkage rate of less than about 5% at a temperature of about 900 to 1000° C. The fourth oxide layer pattern 244 may have a relatively low expansion/shrinkage rate during the subsequent heat treatment process, and thus the fourth oxide layer pattern 244 may expand/shrink less so that dislocations may not occur at a portion of the substrate 210 adjacent to the fourth oxide layer pattern 244.

The dielectric layer pattern 260a may be formed on the gate structures 220a and the second to fourth oxide layer patterns 250, 237 and 244. The dielectric layer pattern 260a may extend in the second direction, and be spaced apart in the first direction, as illustrated in FIG. 8B. In some embodiments, the dielectric layer pattern 260a may include a metal oxide having a high dielectric constant. In other embodiments, the dielectric layer pattern 260a may have a multi-layered structure of an oxide layer, a nitride layer and an oxide layer.

The control gate 270a may be formed on the dielectric layer pattern 260a. The control gate 270a may extend in the second direction, and be spaced apart in the first direction. The control gate 270a may include a conductive material such as polysilicon doped with impurities, a metal, and the like.

Impurity regions 280 may be formed at an upper portion of the substrate 210 adjacent to the gate structures 220a. The impurity regions 280 may serve as source/drain regions.

FIG. 8B illustrates a grid of gate structures 220a according to an embodiment of the present general inventive concept. As illustrated in FIG. 8B, the trenches 216 and 217 represented by dashed lines, are separated from each other in the second direction X and extend along the first direction Z. The gate structures 220a are separated from each other in each of the first and second directions X and Z. The spaces between the gate structures 220a in the first direction Z may be doped to form impurity regions 280, as discussed above.

FIGS. 10A to 10C are cross-sectional views illustrating a method of manufacturing a semiconductor device in accordance with example embodiments. Processes for forming first and third oxide layer patterns filling a first trench and second and fourth oxide layer patterns filling a second trench are substantially the same or very similar to those illustrated with reference to FIGS. 2 to 7, and thus, detailed explanations about the processes are omitted here.

Referring to FIGS. 2 to 7, a plurality of gate structures 220 may be formed on a substrate 210 divided into first and second regions 211 and 212. Each gate structure 220 may include a tunnel insulation layer 221 and a floating gate layer 223 sequentially stacked on the substrate 210.

Upper portions of the substrate 210 may be removed using the gate structures 220 as an etching mask to form first and second trenches 216 and 217 in the first and second regions 211 and 212, respectively. The first and second trenches 216 and 217 may be defined by recessed top surfaces of the substrate 210 and sidewalls of the gate structures 220. The first trench 216 may have a first width, and the second trench 217 may have a second width larger than the first width. First and second oxide layer patterns 235 and 237 may be formed on inner walls of the first and second trenches 216 and 217, respectively. The first oxide layer pattern 235 may partially fill the first trench 216 and have no void therein.

Third and fourth oxide layer patterns 250 and 244 on the first and second oxide layer patterns 235 and 237, respectively. The third oxide layer pattern 235 may fill a remaining portion of the first trench 216 and have no void therein. The fourth oxide layer pattern 244 may fill a remaining portion of the second trench 217 and have a second void 245 therein.

Referring to FIG. 10A, an upper portion of the third oxide layer pattern 250 may be removed to form a recess 257. The recess 257 may be formed by performing a dry etching process.

As illustrated in FIG. 10B, a dielectric layer 260 may be formed on the second, third and fourth oxide layer patterns 237, 250 and 244 and the gate structures 220. The dielectric layer 260 may be formed using a metal oxide having a high dielectric constant. In some embodiments, the dielectric layer 260 may be formed to have a multi-layered structure of an oxide, a nitride and an oxide layer.

As illustrated in FIG. 10C, a control gate layer 270 may be formed on the dielectric layer 260. The control gate layer 270 may be formed a conductive material such as a metal or polysilicon doped with impurities. A planarizing process may be performed on the control gate layer 270.

Referring to FIGS. 8A and 8B again, the control gate layer 270, the dielectric layer 260, the gate structure 220 may be sequentially etched to form a control gate 270a, a dielectric layer pattern 260a, a gate structure 220a sequentially stacked on the substrate 210. The control gate 270a and the dielectric layer pattern 260a may extend in a second direction, and be spaced apart in a first direction perpendicular to the second direction. The gate structures 220a may be spaced apart in the first and second directions.

Referring to FIG. 9 again, impurity regions 280 may be formed by implanting impurities in upper portions of the substrate 210 adjacent to the gate structures 220a.

In some embodiments, the fourth oxide layer pattern 244 may include the oxide having the low expansion/shrinkage rate of less than about 5% at a temperature of about 900 to 1000° C. The fourth oxide layer pattern 244 may expand/shrink less when performing a heat treatment of about 900 to 1000° C., so that the generation of dislocations at a portion of the substrate 210 adjacent to the fourth oxide layer pattern 244 may be prevented.

FIG. 11 is a block diagram illustrating an electronic device including a non-volatile semiconductor device in accordance with some embodiments.

Referring to FIG. 11, the electronic device may include a memory 510 and a memory controller 520 connected to the memory 510. The memory 510 may include the isolation layer structure according to some embodiments.

The memory controller 520 may provide input signals to control operations of the memory 510. In some embodiments, the memory controller provides command (CMD) signals, address (ADD) signals, and input/output signals as the input signals for the memory device. The memory controller 520 may control data of the memory device based on the input signals.

FIG. 12 is a block diagram illustrating an electronic device including a non-volatile semiconductor device in accordance with some embodiments.

Referring to FIG. 12, a host system 700 is connected to a memory 510. The memory 510 may include the isolation layer structure according to some embodiments. Additionally, the memory 510 may include the non-volatile devices according to some embodiments.

The host system 700 may include electronics such as a personal computer, a camera, a portable device, a gaming device, a wireless communication device, and the like. The host system 700 may provide input signals to control the memory 510 which may serve as a data storage device.

FIG. 13 is a block diagram illustrating an electronic device including a non-volatile semiconductor device in accordance with some embodiments.

Referring to FIG. 13, the electronic device may include a portable device 600 such as an MP3 player, a portable media player (PMP), a handheld game console, and the like. The portable device 600 may include a memory 510 and a memory controller 520. The memory 510 may include the non-volatile devices according to some embodiments. The portable device 600 may include an encoder/decoder (EDC)

610, a display element 620, and an interface 670. Audio or video data may be directly input from the EDC 610 to the memory 510, or directly output from the memory 510 to the EDC 610.

FIG. 14 is a block diagram illustrating an electronic device including a non-volatile semiconductor device in accordance with some embodiments.

Referring to FIG. 14, the electronic device may include a computer 800 such as a desktop computer, a laptop computer, or a personal digital assistant (PDA). The computer 800 may include a memory 510 and a central processing unit (CPU) 810 connected to the memory 510. The memory 510 may be directly connected to the CPU 810, or indirectly connected to the CPU 810 via buses. The memory 510 may include the non-volatile devices according to some embodiments.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. An isolation layer structure comprising:
    first and third oxide layer patterns sequentially formed in a first trench defined by a first recessed top surface of a substrate and sidewalls of gate structures on the substrate in a first region, the first trench having a first width, and the first and third oxide layer patterns having no void therein; and
    second and fourth oxide layer patterns sequentially formed in a second trench defined by a second recessed top surface of the substrate and sidewalls of gate structures on the substrate in a second region, the second trench having a second width larger than the first width, and the fourth oxide layer pattern having a void therein.

2. The isolation layer structure of claim 1, wherein the fourth oxide layer pattern includes an oxide having an expansion/shrinkage rate of less than about 5% at a temperature of about 900 to 1,000° C.

3. The isolation layer structure of claim 1, wherein the first and third oxide layer patterns include a middle temperature oxide, and the second and fourth oxide layer patterns include undoped silicate glass.

4. The isolation layer structure of claim 1, wherein the first and third oxide layer patterns include a middle temperature oxide, and the second and fourth oxide layer patterns include a high density plasma chemical vapor deposition (HDP-CVD) oxide.

5. The isolation layer structure of claim 1, wherein the first and second oxide layer patterns cover inner walls of the first and second trenches, respectively.

6. The isolation layer structure of claim 1, wherein each of the gate structures includes a tunnel insulation layer pattern and a floating gate sequentially stacked on the substrate.

7. An isolation layer structure, comprising:
    a substrate having a first trench and a second trench, the first trench having a width less than the width of the second trench;
    a first oxide layer pattern to fill only a portion of the first trench;
    a second oxide layer pattern to fill only a portion of the second trench;
    a third oxide layer pattern to fill a portion of the first trench not filled by the first oxide layer pattern, each of the first and third oxide layer patterns having no void therein; and
    a fourth oxide layer pattern to fill an entire portion of the second trench not filled by the second oxide layer, the fourth oxide layer having at least one void therein.

8. The isolation layer structure of claim 7, further comprising:
    a gate structure including a tunnel isolation layer formed on the substrate and a floating gate formed on the tunnel isolation layer,
    wherein the gate structure forms a portion of a side wall of each of the first and second trenches.

9. The isolation structure of claim 8, further comprising:
    a dielectric layer pattern formed on the gate structure; and
    a control gate formed on the dielectric pattern.

10. The isolation structure of claim 9, wherein the gate structure includes a plurality of gate structures arranged in at least one line along a first axis,
    the first and second trenches extend through the substrate parallel to a second axis perpendicular to the first axis, and
    the dielectric layer pattern and the control gate extend across the plurality of gate structures along the first axis.

11. The isolation layer structure of claim 7, wherein the first oxide layer includes side portions adjacent to the side walls, and
    the side portions increase in thickness in a direction from an open end of the first trench toward a base of the trench.

12. The isolation layer structure of claim 7, wherein the second oxide layer pattern has a substantially uniform thickness.

13. The isolation layer structure of claim 7, wherein the first trench has a depth less than a depth of the second trench.

* * * * *